United States Patent [19]

Dorman et al.

[11] Patent Number: 4,862,927
[45] Date of Patent: Sep. 5, 1989

[54] DOUBLE-ENDED TERMINATION AND ROUTING ARRANGEMENT FOR AN AUTOMATED WIRING SYSTEM

[75] Inventors: John G. Dorman, Upper St. Clair Twp., Allegheny County; Mark E. Wylie; Robert H. Sturges, both of Mt. Lebanon, all of Pa.

[73] Assignee: Westinghouse Electric Corp., Pittsburgh, Pa.

[21] Appl. No.: 236,484

[22] Filed: Aug. 25, 1988

[51] Int. Cl.[4] .............................................. B21F 3/00
[52] U.S. Cl. .................................. 140/92.1; 29/56.6; 140/93 R
[58] Field of Search ....................... 140/92.1, 93, 92.2; 29/56.6, 755

[56] References Cited

U.S. PATENT DOCUMENTS

| | | | |
|---|---|---|---|
| 3,699,630 | 10/1972 | Tarbox et al. | 29/56.6 |
| 3,885,161 | 5/1975 | Tarbox et al. . | |
| 3,907,007 | 9/1975 | Hobbs et al. | 29/56.6 X |
| 4,126,935 | 11/1978 | Rhines et al. . | |
| 4,363,165 | 12/1982 | Suzuki et al. | 29/56.6 X |
| 4,593,452 | 6/1986 | Keahey et al. . | |
| 4,603,476 | 8/1986 | Tarbox | 140/92.1 X |
| 4,653,159 | 3/1987 | Henderson et al. . | |
| 4,677,734 | 7/1987 | Bloch et al. . | |
| 4,781,227 | 11/1988 | Cross | 140/92.1 |

FOREIGN PATENT DOCUMENTS 2025272 1/1980 United Kingdom .

*Primary Examiner*—Timothy V. Eley
*Assistant Examiner*—Carl J. Arbes
*Attorney, Agent, or Firm*—G. E. Hawranko

[57] ABSTRACT

A wire harness assembly arrangement acquires, prepares and routes various sections of wire by means of a wiring tool apparatus attached to a robotic manipulator. The tool apparatus moves coincident with an arm of the process controlled robotic manipulator and acquires the wire section through a front end portion. The first end of the wire section is fed into the tool apparatus and through a tail end portion of the tool apparatus. The next portion is wound around a spool member disposed within the tool apparatus and rotatable in response to a controlled motor operation. The front end portion is movable in relation to a wire feeding unit so that the wire section wound around the spool member is wound in a helical manner. The wire harness assembly arrangement can also include a strip/crimp station to prepare the acquired wire section for termination. The process controlled robotic manipulator then routes the acquired wire section along a predetermined path to form a part of the wire harness assembly. During the wire routing operation, the motor exerts a reverse torque on the spool member to prevent the wire section from springing off of the spool member.

14 Claims, 5 Drawing Sheets

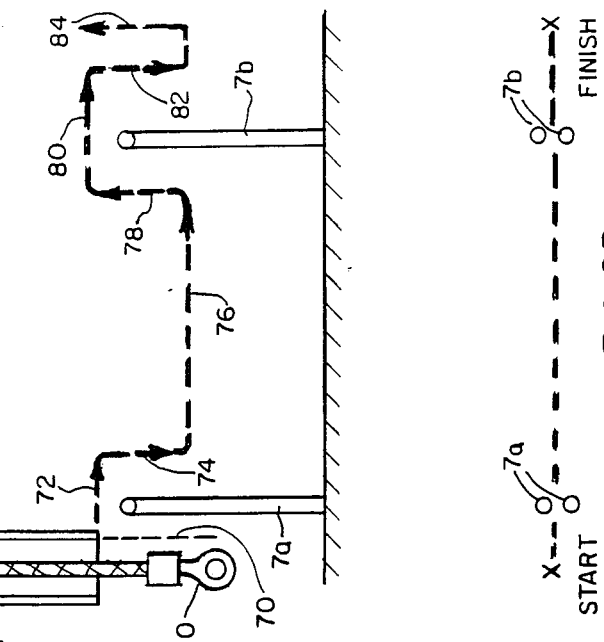
FIG. 8A.
FIG. 8B.
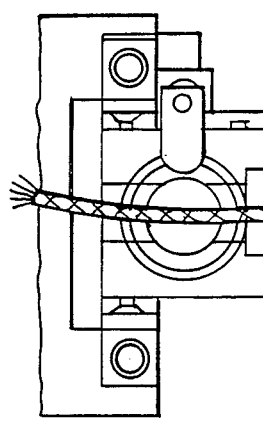
FIG. 5.
FIG. 6.

DOUBLE-ENDED TERMINATION AND ROUTING ARRANGEMENT FOR AN AUTOMATED WIRING SYSTEM

BACKGROUND OF THE INVENTION

1. Field of the Invention

This invention relates to a method and apparatus for automatically assembling a wire harness arrangement which can be used on a wide variety of electrical devices. More particularly, this inventions relates to such a wire harness assembly arrangement which provides for terminating and routing individual sections of wire that combine to form the wire harness assembly typically used to electrically connect the various components that make up today's complex electronic and electrical devices. Additionally, this invention relates to such a method and arrangement as can be used in conjunction with a robotic manipulation system to facilitate the performance of such wire harness assembly operation.

2. Description of the Prior Art

It is known that, along with the recent growth in the application of miniature electronic circuit components designed to improve practically all aspects of our lifestyles, there comes a need to more accurately and efficiently perform the wiring and assembly operations that comprise a large portion of the electrical devices that make use of these electronic components. Additionally, because such electrical devices typically employ a variety of integrated circuits as well as other electronic and electrical devices which vary in size and require correspondingly variable gauges and lengths of wiring to interconnect them, the automation of such an operation would be advantageous over the manual performance of such due to the space limitations under which this wiring operation must be performed.

It is further known that because of the cost improvement that has occurred in the electronic component markets, when considering the overall costs of an electrical device, the cost of assembling the device has increased significantly in proportion to the material component cost associated with the device. As such, there has been an increased desire to maximize the performance of the wire harness assembly operation while at the same time, maintaining or improving the cost level of the assembly process relative to the material costs.

A further problem that has been encountered in automatic wire harness assembly operations has been that, during the routing process, a segment of wire may get tangled upon itself or possibly damaged such that the routing step cannot be properly completed. It is therefore desireable to provide an arrangement that, during the wire preparation step, the wire segment is arranged in a manner to prevent tangling during the subsequent routing step.

In meeting these objectives, there have been several arrangements introduced which are either directed to specific problems related to previously used automatic or manual wiring techniques to which are directed to distinct needs of a particular industry. One of the earliest automatic cable harness assembly arrangements can be found in U.S. Pat. No. 3,885,161 issued to Tarbox et al. on May 20, 1975 and which is assigned to the Hughes Aircraft Company. In this patent, the cable harness assembly arrangement provides that the routing of the wire sections is done along predetermined paths which are associated with cable groupings. This approach does not provide for the essentially simultaneous terminating and routing operations that maximize efficiencies with a wire harness arrangement as found in the more recent developments in this area. Nor does this arrangement easily lend itself to a more random wire distribution as can occur when the wire harness assembly is not restricted to a cable type of layout.

Another example of a wire harness assembly arrangement which is directed to a specific need of a particular industry can be found in U.S. Pat. No. 4,126,935 issued to Rhines et al on Nov. 28, 1978 and assigned to AT&T, Bell Laboratories. The approach taught in this patent deals with the mass termination of groupings of twisted pairs of wires onto slotted beam connector blocks. As this approach is intended for use in the communications industry, special features are provided such as a pair indexing head, a comb and a presser head for selectively terminating individual pairs from a bundle of pairs.

Yet another wire harness assembly arrangement can be found in the British Patent No. 2,025,272 issued to R.D. Gibbons on Jan. 23, 1980. In this patent, wire is acquired from a feeding device, prepared for termination and routed among a pattern of pins set into a formboard. This arrangement was found satisfactory for use with light gauge wiring and where the accuracy of the end portion of the wire was not a critical factor. However, where it was necessary to provide for a variety of sizes of wire and to have control over the handling and termination of the end portion of the segment of wire, this arrangement could not effectively be used.

Other wire harness assembly arrangements can be found in U.S. Pat. Nos. 4,593,452 issued to Keahey et al on June 10, 1986 and assigned to Amp Inc., and 4,677,734 issued to Bloch et al and assigned to the Boeing Company. In U.S. Pat. No. 4,593,452, a robotic system having a gripper assembly, manipulates various jigs and connectors to perform the wire lacing operation. Additionally, the wire is supplied from a holder having wire feed wheels and a severing mechanism. In U.S. Pat. No. 4,677,734, a robotic system includes a wire preparation subsystem, a wire reeling subsystem, and a wire queuing subsystem among other subsystems.

U.S. Pat. No. 4,653,159 issued to Henderson et al. on Mar. 31, 1987 and assigned to the same assignee as the present application, discloses a wire harness assembly arrangement using a conventional robotic transport system to perform the wire preparation and harness formation operations.

Though the heretofore discussed wire harness assembly arrangements provide distinct advantages and benefits to the particular problems to which they are directed, there remains a need to provide a single wire harness assembly arrangement which can accommodate a wide variety of industrial situations, can operate using any type or size of available wiring material, does not require fitting the robotic manipulator with different tooling ends to meet different wiring situations, and provides for the positive control of the section of wire over the entire path in which it is to be laid. Additionally, it would be advantageous if such a wire harness assembly arrangement could perform the wire acquisition phase of operation so that the wire section was uniformly distributed and stored within the tooling device thereby insuring that during the subsequent dispensing or routing phase of operation, the wire section would not become tangled or damaged in any way.

SUMMARY OF THE INVENTION

The object of this invention therefore is to provide a wire harness assembly arrangement which positively controls the receiving and preparation of the wire segment over the entire length of the wire segment in order to prevent binding of the wire segment during the routing process.

It is a further object of this invention to provide such an automatic wire harness assembly arrangement which has the capability of performing double ended terminations on the wire segment and which can perform such termination operation over a substantial range of wire lengths and gauges.

With this object in view, the present invention provides an automatic wiring arrangement for assembling wire harnesses having a plurality of wire segments included therein. The automatic wiring arrangement comprises a process controlled robotic manipulator; a means for selectively controlling the robotic manipulator to a plurality of discrete positions within a predefined work area; and a tool means connected to the robotic manipulator for coincident movement therewith, the tool means being effective, during a first step, for receiving one of the wire segments, and during a second step, for routing the wire segment within the work area. The tool means further includes a spool member and a winding means for winding the wire segment around the spool member and, still further includes a first end portion movable in a direction parallel to the axis of rotation of the spool member such that the wire segment is wound on the spool member in a helical manner.

BRIEF DESCRIPTION OF THE DRAWINGS

The present invention will be more fully understood from a reading of the description of the preferred embodiment in conjunction with the drawings, in which:

FIG. 5 is an elevational cross-sectional view of a front end portion of the tool device shown in FIG. 3.

FIG. 6 is an elevational frontal view of the tool device shown in FIG. 3.

FIGS. 8a and 8b are elevational views shown partly in section of the front end portion of the tool device shown in FIG. 5 as it operates to route the wire segment within the work area.

DESCRIPTION AND OPERATION

Figure 1:
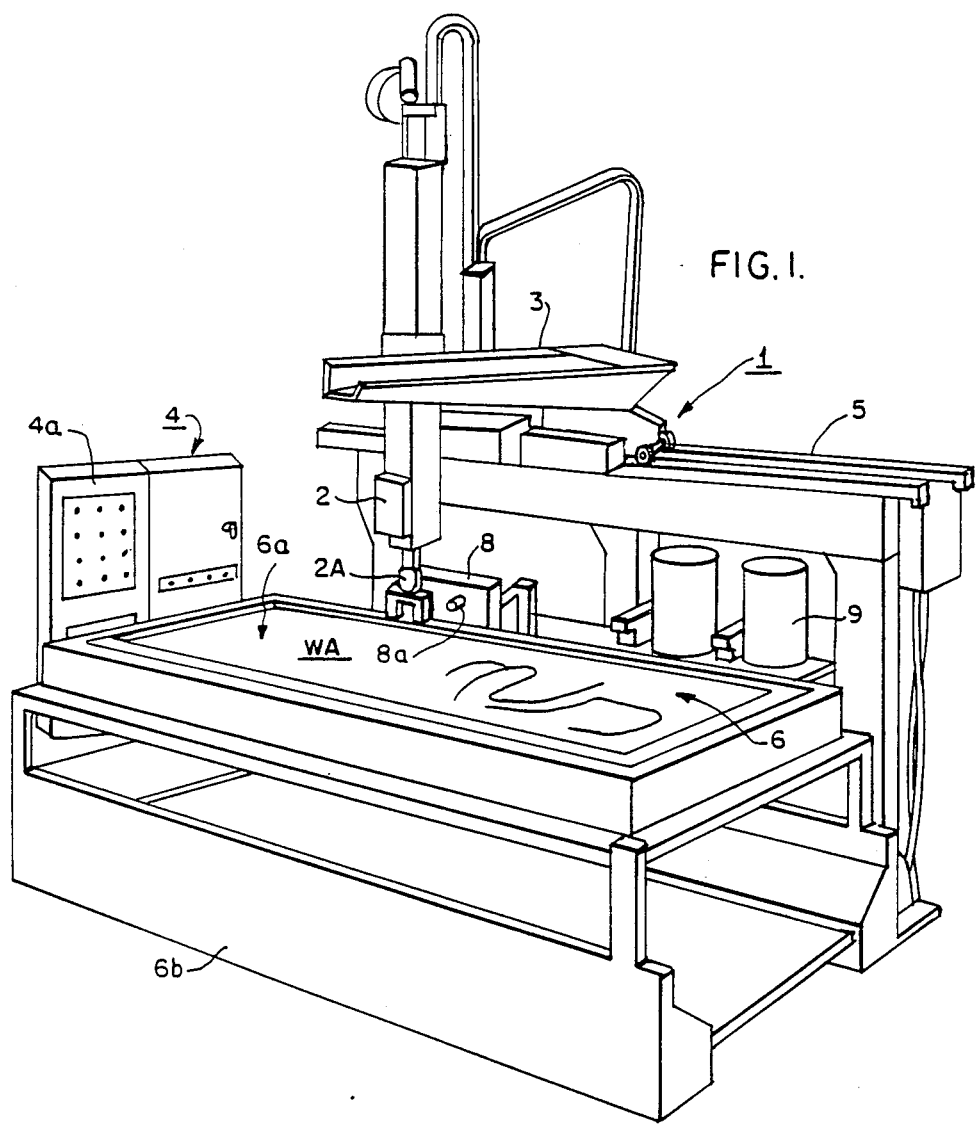
FIG. 1 is a representational view of a wire harness assembly system using a robotic manipulator.

As illustrated in FIG. 1, the wire harness assembly system of the present invention includes a robotic manipulator 1 having a vertically disposed robotic arm member 2 which extends from a horizontally disposed arm member 3 and is positionable within a work area designated WA, by means of an operating arrangement or numerical control approach as it is typically referred. The operating arrangement or numerical control program is contained within a controller device 4. The robotic manipulator 1 can be one of a variety of robotic devices which are currently in use for a wide range of industrial operations. An example of one such robotic system is the UNIMATE Series 6000 System offered by the Westinghouse Electric Corporation of Pittsburgh, PA. This robotic system is described in U.S. Pat. No. 4,571,149, issued to Soroka et al., and assigned to the same assignee as the present application; this patent being hereby incorporated by reference as if fully set forth herein. The vertical arm member 2 is disposed along what is typically referred to as the Z-axis and is equipped with a quick-change tool adapter 2A at its bottom-most end so that a variety of tool devices can be interchanged to adapt the robotic manipulator 1 to perform various operations. In a typical industrial robotic application, the quick change tool adapter 2A will be secured to a wrist mechanism (not shown) for a more controlled movement of the tool member attached thereto. Included in this variety of operations is the fabrication of wire harness assemblies using a wire harness tool 10 which is the subject of the present invention and which will be described hereinafter in further detail. In addition to the vertical arm member 2 which is disposed along the z-axis, a first horizontal member 3 is disposed along the y-axis and a second horizontal member 5 disposed perpendicular to the first horizontal member 3, is disposed along the x-axis. It can be appreciated that though FIG. 1 illustrates a three-axis, gantry style robotic manipulator which is operative in at least the cartesian coordinates, other robotic arrangements will operate as well in conjunction with the wire harness assembly arrangement of the present invention.

The controller device 4 is typically a processor based controller device having associated therewith, a central processing unit or CPU (not shown), a memory portion (not shown) where the instructions and data are stored for the operating and application programs of the controller device 4, and, the necessary I/O devices which allow for the communication of the control signals between the controller devices 4 and the robotic manipulator 1. As discussed, also associated with the controller device 4 is the operating program and an application program which is typically generated by means of the operating program and which is effective for dictating the manner by which the wire harness assembly arrangement will be controlled to achieve the desired wiring configuration. It can be appreciated that the operating program is a combination of a control program having a specific language and set of control instructions that will remain the same for every application and which in fact allow for the creation of the application program.

As further seen in FIG. 1, the controller device 4 includes a control panel 4a disposed on the front portion thereof, the control panel 4a allows the operator to manually input control variations to the operating program and further includes display components by which the status of various memory locations can be examined. It can be appreciated that the application program can be configured in an essentially infinite number of manners to accommodate the variations in the desired configurations of the wire harness assemblies. Accordingly, it need only be understood that the application program performs the function of instructing the robotic manipulator 1 and more particularly, the vertical arm member 2, to move in particular paths to first acquire the wire section, then to route the wire section to the desired starting and ending positions along a predetermined path and finally, to end the routing operation and go on to the next wire section.

In order to perform the wire harness assembly operation, the robotic manipulator 1 must move within the work area WA which in the present embodiment is within the area of a form board assembly 6. The form board assembly 6 is illustrated in FIG. 1 as a table-like arrangement having a top surface portion 6a on which posts 7 can be disposed in a variety of configurations to serve the function of setting out the boundaries of the routing paths for the various wire cable sections which form the wire harness assembly.

As seen in FIG. 1, disposed to the side of the form board assembly 6 in an area beneath the x-axis of the robotic manipulator 1, are the necessary components for acquiring the wire sections and for stripping, crimping and terminating the wire sections. A wire feed unit 8 provides a station at which the tool member 10 can acquire the section of wire to be routed in the wire harness assembly. The wire feed unit 8 includes an extending nozzle portion 8a through which the wire section is fed to the tool member 10 in a manner to be described hereinafter in further detail. Disposed adjacent the wire feed unit 8 is at least one crimp/strip station 9 which performs the function of preparing the wire section for routing; that is, the crimp/strip station 9 takes a section of wire, strips the insulation back a predetermined length and then installs some sort of termination device done for instance, by crimping of a wire terminal thereon. It can be appreciated that this function can be performed by a dual crimp/strip station arrangement so that more than one wire end can be prepared at a time. Additionally, the wire section need not have a terminal crimping type of operation performed but can be routed merely having the wire sections prepared by stripping the insulation for the desired length.

Figure 2:
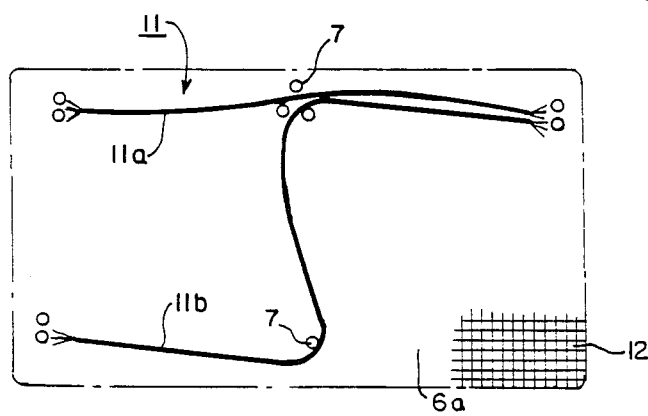
FIG. 2 is an illustrational view of a typical wire harness assembly.

As seen in FIG. 2, an elevational view of the form board top surface portion 6a is illustrated having an example of a wire harness assembly 11 disposed thereon. For illustration purposes, this particular example shows the wire harness assembly as including one portion 11a which is composed of a bundle of wire sections and another portion 11b which is composed of one wire section. The bundled wire portion 11a can have a number of individual wire sections which share a portion of the routing path with each other, and when such individual wire sections approach the point at which they will be terminated, they can be individually flared off from the bundle and routed to their respective points of termination. The top surface portion has formed thereon, a plurality of placement holes 12 which are arranged so that a large number of wire harness assembly patterns can be achieved merely by arranging the posts 7 in various configurations. In fact, the placement holes 12 can be provided in the top surface portion 6a be means of a weave-like construction which is illustrated in the lower, righthandmost corner of the top surface portion 6a and which allows that, the placement posts 7 which are essentially uniform in diameter, can be closely spaced relative to one another.

The form-board assembly as shown in FIG. 1 includes a base portion 6b which can allow for the top surface portion 6a to be operated either in a fixed manner, or a programmable manner; that is, the top surface portion 6a can either be disposed relative to the robotic manipulator 1 in a stationary manner or it can be programmed to move in conjunction with the movements of the robotic manipulator 1.

Figure 3:
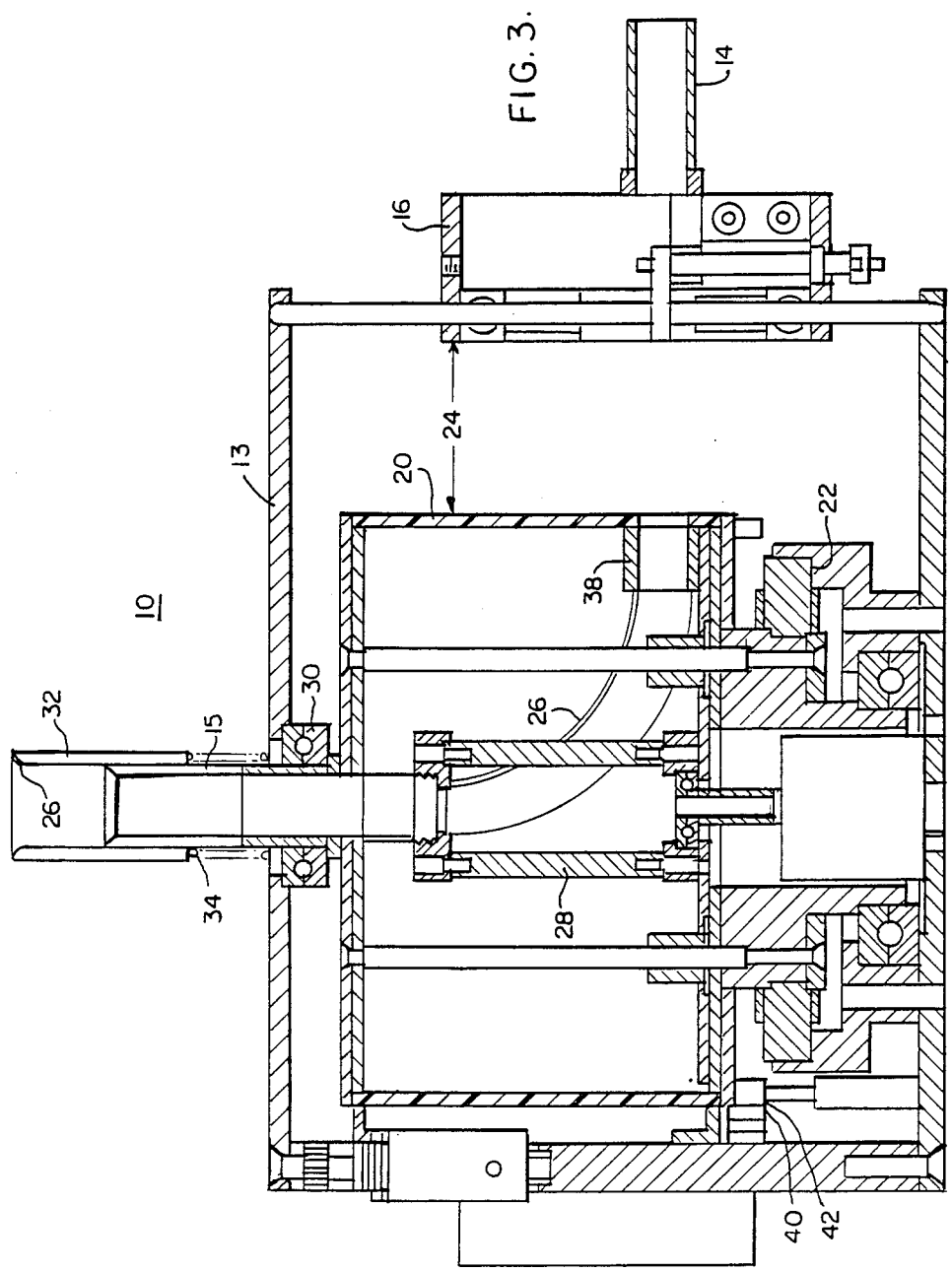
FIG. 3 is an elevational cross-sectional view of a wire harness assembly tool device constructed in accordance with the invention.

As seen in FIG. 3, the tool member 10 which attaches to the quick change tool adapter 2a at the bottom-most end of the vertical arm member 2 (shown in FIG. 1), includes a housing 13 which has formed at one end thereof, a front end nozzle 14. The front end nozzle 14 is disposed along a line parallel to the longitudinal axis of the housing 13 and extends outwardly of the housing 13 so that the tool member 10 does not have to be brought into such close proximity to the wire feed unit 8 (shown in FIG. 1), thereby reducing the risk that, should any undesired contact between these two components occur, substantive damage to the tool member 10 would result. Additionally, the front end nozzle 14 is constructed having an inside diameter which allows for the insertion of the extending nozzle 8a of the wire feed unit 8 (shown in FIG. 1) into the front end nozzle 14 in a manner to insure that the wire section is properly fed into the tool member 10.

Also extending outwardly from the housing 13 in a manner similar to the front end nozzle 14, is a tail end nozzle 15. The tail end nozzle 15 extends from the housing 13 at an angle perpendicular to the longitudinal axis of the housing 13 which, since the front end nozzle 14 is disposed parallel to this longitudinal axis, results in the tail end nozzle 15 being disposed perpendicular to the front end nozzle 14. It can be appreciated that, by this arrangement, the front end nozzle 14 is positionable so as to be within easy reach of the wire feed unit 8 and the crimp/strip station 9 while the tail end nozzle 15 need only be positionable so as to be within easy reach of the crimp/strip station 9.

The front end nozzle 14 is disposed on a carriage element 16 which rides freely along a pair of rails 17 which is achieved by the movement of the vertical arm member 2. The winding motion occurs as a result of the rotational movement of a motor driven spool member 20 which is rotated by means of a motor 22. The operation of the motor 22 is, of course, controlled by the controller device 4 according to the needs of the particular wire harness configuration. A powered mechanical stop 40 operates under the control of the controller device 4 and is effective for engaging a pin member 42 which is secured to the portion of the spool member 20 thereby disposed in opposing relation to the mechanical stop 40 locking the spool member into a specific position.

It should be understood that it may not be necessary for the motor 22 to rotate the spool member 20 during every routing operation. For instance, if a short section of wire is to be routed, it may not be necessary to utilize the spool member 20 at all. In such an application, the tool member 10 may only have to acquire the wire section at the front end nozzle 14 and direct it through the spool member 20 to the tail end nozzle 15 where it may or may not have a terminal crimped thereto depending on the requirements of the particular application.

As previously stated, when it is necessary to provide a short wire section, the spool member 20 need not be utilized. Under this circumstance, the wire feed unit 8 is operable so that the extending nozzle 8A and hence, the wire section, extends substantially across a gap 24 of a predetermined length and toward the outer diameter of the spool member 20; therefore, there is no need to wind an additional length of wire around the spool member 20. Upon the initiation of a wire acquiring operation, the controller device 4 will have rotated the spool member 20 so that the opening end of an elbow shaped extension tube 26 disposed within the spool member 20, aligns with the end of the front end nozzle 14 internal to the tool member 10 when the front end nozzle 14 and the carriage device 16 are in a starting position.

The extension tube 26 connects the tail end nozzle 15 to the edge of the spool member 20 and, by means of the gap 24, to the front end nozzle 14. Additionally as seen in FIG. 3, the extension tube 26 attaches to the tail end nozzle 15 at the axis of rotation of the spool member 20 which, at the top portion, is the point at which the tail end nozzle 15 extends outwardly of the housing 13. A bearing member 30 is disposed in surrounding relation to the tail end nozzle 15 at the point where the tail end nozzle 15 exits the housing 13, the bearing member 30 being effective for insuring smooth rotational movement of the spool member 20 about the tail end nozzle 15 when the spool member 20 is being rotated by the motor 22. A support arrangement 28 disposed coaxially within the spool member 20 insures that the connection between the extension tube 26 and the tail end nozzle 15 is maintained.

At the portion of the tail end nozzle 15 that extends outwardly of the housing 13, there is attached in a partially surrounding relation to the tail end nozzle 15, a nozzle extender 32. The nozzle extender 32 can be made movable in relation to the tail end nozzle 15 by means of a spring loading arrangement whereby a spring member 34 is biased against the housing 13 and surrounds the portion of the tail end nozzle 15 which extends outwardly of the housing 13. The nozzle extender 32 is effective for constraining the wire section during stripping, crimping or terminating operations. A chamfered end 36 is provided for the nozzle extender 32 so that the terminated wire end (not shown) does not get caught in the tail end nozzle 15. It should be noted that for a double ended termination operation involving an arbitrary length of wire, placement of the tail end nozzle 15 and the nozzle extender 32 along the axis of the spool member 20 permits location of the wire end regardless of the length of wire used; this is true regardless of the point along the circumference of the spool member where the end of the extension tube 26 ends up following the rotation of the spool member 20.

A clamp member 38 is attached to the end of the extension tube 26 which faces the inside end of the front end nozzle 14. The clamp member 38 resides just within the outer diameter of the spool member 20 and is effective, when actuated by the controller device 4, for fixing the wire section in a predetermined position. The clamp member 38 works in conjunction with a clamping feature of the wire feed unit 8 to achieve the specific length of wire section needed. The measurement feature of the wire feed unit 8, under the direction of the controller device 4, fixes the specific length of wire which the wire feed unit 8 then guides into the tool member 10 by insertion of the extending nozzle portion 8a of the wire feed unit 8 into the front end nozzle 14 of the tool member 10. As will be described later in further detail, the nozzle portion 8b extends through the carriage member 16 into close proximity to the spool member 20 until the wire section is fully fed into the tool member 10 (corresponding to the equivalent length "d" of wire extending from the end of the nozzle extender 32). At this time, the wire feed unit 8 is clamped and the tool member 10 is withdrawn a distance equivalent to "d" to thereby provide a gap between the carriage member 16 and the spool member 20. The clamp member 38 is then actuated thereby preventing the wire section from being pulled back away from the spool member 20.

Figure 4:
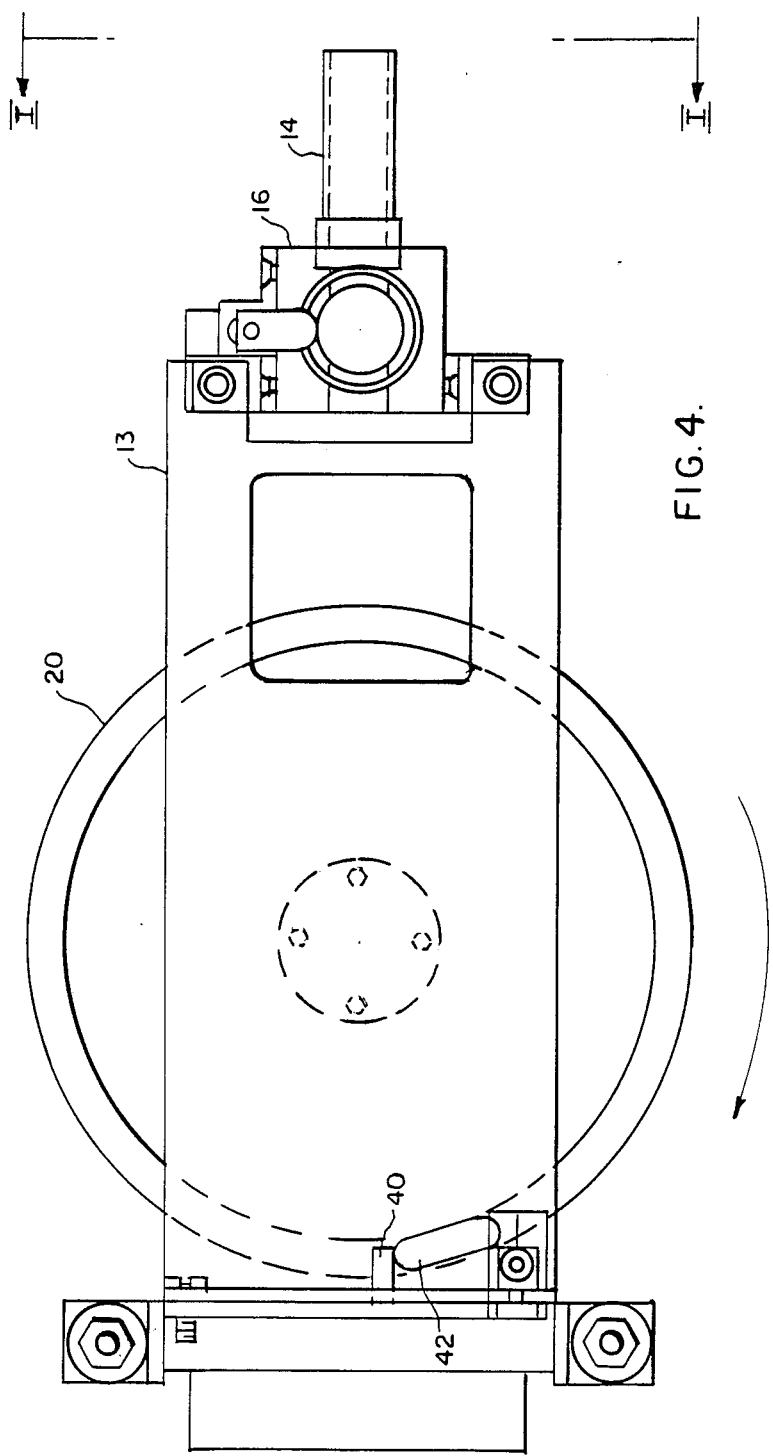
FIG. 4 is an elevational, side view of the tool device shown in FIG. 3 but rotated about the longitudinal axis of FIG. 3.

The view of the tool member 10 shown in FIG. 4 illustrates the placement of the spool member 20 relative to the front end nozzle 14 which placement is responsible for the provision of the gap 24 shown in FIG. 3. As also illustrated in FIG. 4, the relationship between the mechanical stop 40 and the pin member 42 is one whereby, following initiation and with continuous operation, the powered mechanical stop 40 will be withdrawn so that the pin member 42 can pass thereby without being impeded by the mechanical stop 40.

FIG. 5 illustrates an elevational, perspective view of the carriage member 16 with the front end nozzle 14 secured thereto. Also shown within the carriage member 16 is a front end clamp 44 which grips the wire section so that the wire feed unit 8 (shown in FIG. 1) can cut the section of wire at the proper location. The front end clamp 44 can be an electrically actuated device whereby an electrical signal received from the controller device 4 operates to urge a movable clamping member 44a into contact with the wire section thus urging the wire section against a stationary portion 44b. It can be appreciated that alternate arrangements for providing this clamping operation can be achieved without departing from the scope of applicants' invention as set forth herein. As one example, an alternate electrical arrangement can be provided whereby a force is exerted radially inward against the wire section. Additionally, a further example of a clamping arrangement would be one whereby the force exerted was derived by means of a hydraulic or pneumatic arrangement in which hydraulic or pneumatic pressure would be introduced into a chamber in which a piston-like element such as the movable clamping member 44a would be disposed.

As previously discussed, shown more clearly in FIG. 6, the carriage member 16 is movable along a pair of rails 17 which are secured to the housing 13 of the tool member 10. Rail guides 48 are formed in the carriage member 16 to allow easy movement of the carriage member 16 along the rails as the wire section is being wound on the spool member 20. The movement of the carriage member 16 is accomplished without the need of an active motive element; because of the sliding relationship between the rail guides 48 and the rails 17, the force of the winding action of the wire section onto the spool member 20 along with the movement of the tool member 10 during movement of the vertical arm member 2 is sufficient to move the carriage member 16 along the rails 17. The movement of the robot vertical arm member 2 provides the primary force for movement of the carriage member 16. As such, the rate of movement of the vertical arm member 2 must be programmed so that the rate of release of wire from the wire feed unit 8 is coordinated to result in the release of the proper length of wire. The application program portion of the controller device 4 provides for this relationship and as well, accommodates the distinctions between the outside diameter of various sizes or gauges of wire that may be utilized to form the wire harness assembly.

Since this sliding movement of the carriage member 16 would be determined at times when the wire section must be held in a specific position, it is necessary that at those times, the carriage member be locked against movement. For this purpose, the carriage member 16 is provided with a locking arrangement 50 which engages the top rail 17 as shown in FIG. 6. The carriage member 16 can be locked when it is at the center of the spool member 20 to allow for an easy wire routing operation. The angle of the wire section relative to the spool member 20 is optimized during the routing operation when the carriage member 16 is near the center of the spool member 20.

The locking arrangement 50 includes a locking pin 52 which, when engaged, extends through a lock opening 54 formed in the upper one of rail pair 17. The engagement and disengagement of the locking arrangement is done under the control of the controller device 4. By extending through the lock opening 54, the locking arrangement 50 achieves a positive locked engagement thereby preventing any slippage between the carriage member 16 and the rail pair 17 during a locked condition. In order to achieve an unlocked condition, the controller device 4 must issue a specific unlock instruction; in this manner, it can be appreciated that a failure of the controller device 4 to issue the unlock instruction will reduce the risk of any potential damage to the carriage member 16 or the tool member 10, a risk that could be present if the contrary arrangement were provided. In other words, if the locking arrangement 50 were to be operated so that an unlock condition prevailed and an instruction were needed to engage the locked condition, the carriage member 16 would be free to move under a condition where the controller device 4 failed to issue the lock instruction thereby exposing the carriage member 16 and ultimately the tool member 10 to potential damage.

Figure 7:
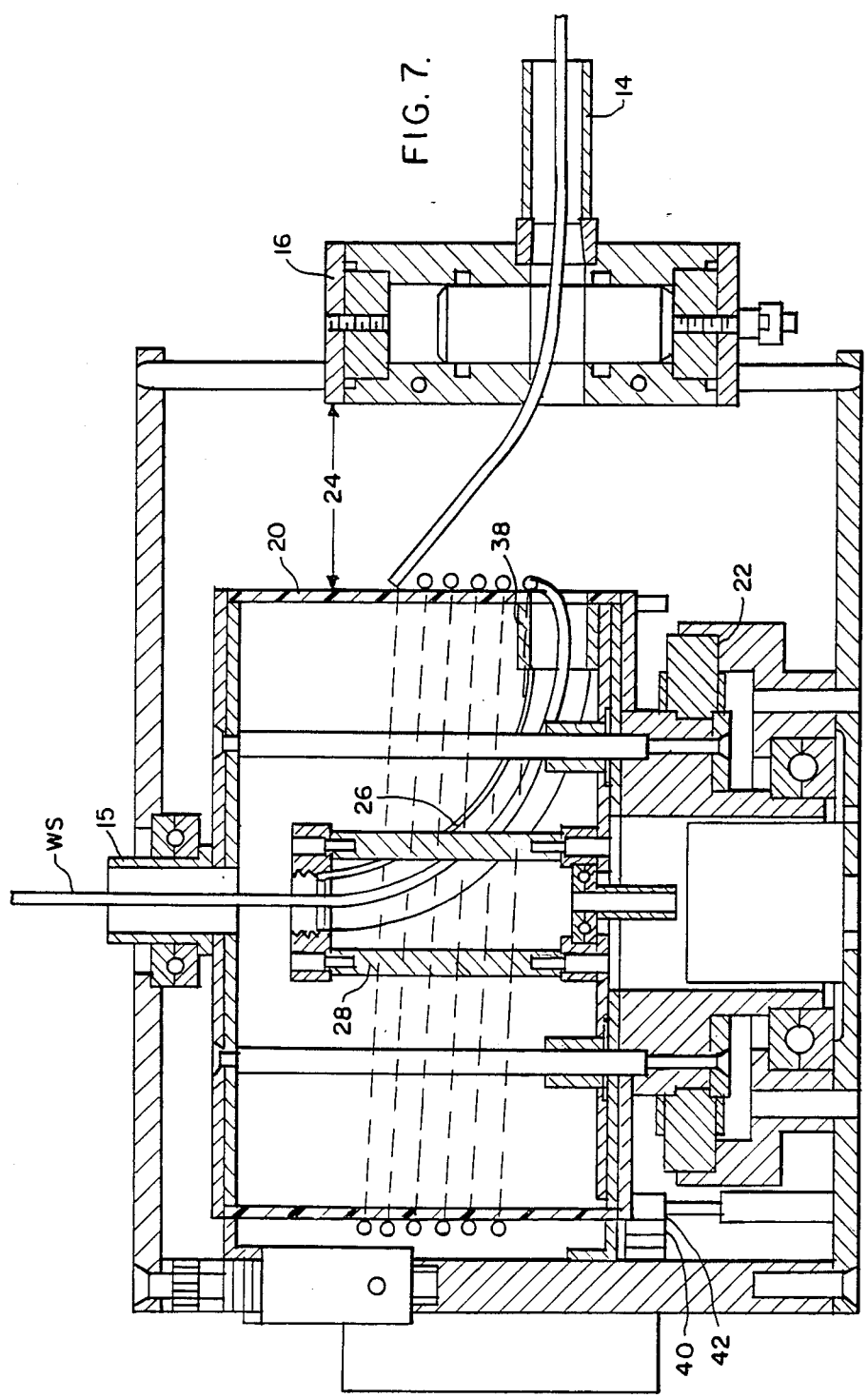
FIG. 7 is a further view of the tool device shown in FIG. 3 but having the wire segment shown therewith.

The tool member 10 illustrated in FIG. 7 is essentially the same as that shown in FIG. 3 except for the addition of a section of wire wound on the spool member 20. The wire section, designated ws, has a first end which extends from the tail end nozzle 15 for a predetermined length. This length of this first end is set so that the termination element (not shown) can be easily installed. That portion of the wire section ws that is wound around the spool member 20, is wound in a helical, uniform manner so that none of the portions of the wire section ws that are wound around the spool member 20 overlap one another. Once the sufficient amount of the wire section ws has been helically wound on the spool member 20, the remaining portion of the wire section ws extends across the gap 24, through the front end nozzle 14, and out of the external end of the front end nozzle 14 for a predetermined length which allows for the installation of a termination element (not shown) at the second end of the wire section ws.

In operation, the wire harness assembly arrangement and more specifically, the tool member 10 is effective in essentially two distinct phases. The first phase of operation is the acquisition/termination phase whereby the tool member 10 acquires the wire section ws from the wire feed unit 8; the second phase of operation is the routing phase whereby, once the wire section ws has been acquired, the tool member 10, in association with the movement of the robotic manipulator 1, routes the wire section ws along the proper path on the form board assembly 6.

The first phase of operation will be discussed with reference to FIG. 7. Initially, the robotic manipulator 1 moves under the control of the controller device 4 so that the front end nozzle 14 is positioned in a manner to accept the nozzle portion 8a of the wire feed unit 8 therein. The nozzle portion 8a of the wire feed unit 8 is inserted through the front end nozzle 14 for a distance so as to come into close proximity to the spool member 20. By this positioning, it is insured that there is no sag in the section of wire as it travels from the wire feed unit 8 to the interior of the tool member 10. At or before this time, the controller device 4 has also positioned the spool member 20 so that the opening into the extension tube 26 is aligned with the end of the nozzle portion 8a of the wire feed unit 8 when it has been inserted into the tool member 10. This positioning is accomplished under the control of the controller device 4 by means of the motor 22 acting in cooperation with the stop mechanism 40,42. In this manner, the controller device 4 need not control the motor 22 to such a precise degree so as to achieve a particular angular position of the motor 22 but can merely rotate the spool member 20 until the pin member 42 contacts the powered stop member 40.

Once the spool member 20 is aligned with the nozzle portion 8a of the wire feed unit 8, a fixed length of wire is fed by the wire feed unit 8 into the interior of the spool member 20 under control of the controller device 4. The fixed length of wire is then directed by the extension tube 26 toward the axis of the spool member 20 and from there, the length of wire is directed outwardly of the tool member 10 through the tail and nozzle 15. The length of wire protrudes a sufficient length from the tail end nozzle 15 so that the end of the length of wire can be stripped and crimped at a later time if necessary.

Should a length of wire less than the length determined by the geometry of the spool member 20 be required, only that length is fed by the wire feed unit 8. It can be appreciated that such a section of wire can be terminated only at the front end nozzle 14 since the wire section cannot protrude a sufficient length through the tail end nozzle 15.

After feeding the portion of the length of wire through the extension tube 26 and out the tail end nozzle 15 the sufficient amount, the wire feed unit 8 is clamped and the tool member 10 is moved until the gap d between the spool member 20 and the end of the carriage member 16 is established. The clamp member 38 then clamps the wire section against further movement.

Having loaded the proper length of wire into the spool member 20 and out of the tail end nozzle 15, the remaining section of wire is then helically wound around the spool member 20. Prior to winding the wire around the spool member 20 however, the controller device 4 must release the mechanical stop 40,42. At this time, the clamp member 38 and the clamping feature of the wire feed unit are released as well.

The winding process is initiated upon the controller device 4 actuating the motor 22; the rotational speed of the motor 22 is coordinated with the wire feeding rate of the wire feed unit 8 so as to prevent a slacking or tensioning condition of the wire as it is fed onto the spool member 20. During the winding process, the front end nozzle 14 is compelled to move in a direction parallel to the axis of the spool member 20 by the motion of the robotic manipulator.

The motion of the carriage 16 and front end nozzle 14 arrangement is accomplished by means of the programmed release of the latching arrangement 50 which thereby allows the carriage member 16 to move along the rails 17 under the force exerted by the programmed movement of the robot vertical arm member 2. The rate of movement of the vertical arm member 2 is controlled so as to accommodate the diameter of the wire section that is fed from the wire feed unit 8 and the diameter of the spool member 20 on which the wire is wound. This rate of arm movement also results in the wire being helically wound on the spool member 20 without any one winding of wire overlapping an adjacent winding of wire.

When the wire feeding and winding operation is completed, the vertical arm member 2, under the control of the controller device 4, moves the carriage member 16 and front end nozzle 14 arrangement to its original position where the latching arrangement 50 is restored to its locked condition thereby fixing the wound section of wire to the preselected length. At this time, the front end clamp 44 which is disposed inside the carriage member 16 is actuated to grip the wire section so that the wire feed unit 8 can cut the wire from the reel (not shown). The end of the wire section created by cutting the wire section ws at the wire feed unit 8, extends outwardly of the front end nozzle 14 is sufficient length to allow the later installation of a termination device thereon.

Once the wire section has been wound on the spool member 20, the wire feed unit 8 is fully withdrawn from within the front end nozzle 14 and the vertical arm member 2 can move the tool member 10 to an alternate location along the form board 6 as for instance, to the wire stripping and termination devices 9 so that the termination element 60 can be installed if necessary.

The operation of routing that wire section is illustrated by way of example as shown in FIGS. 8a and 8b. Routing the terminated wire begins by positioning the front end nozzle 14 so that the wire end lies between two (or more) closely spaced placement posts 7a and 7b. The tool member 10 is then directed inward toward the top surface portion 6a of the formboard 6 as shown as segment 70 of the routing path. The tool member 10 is then drawn in the plane of the formboard 6 causing the terminal element 60 to be captured by a first set of placement posts 7a, which action is shown as segment 72 of the routing path. The next segment of the routing path, segment 74, shows the tool member 10 being moved a short distance toward formboard 6 thus causing the wire end to be forced between the placement posts 7a. Subsequent movement of the wire section is in the plane of the formboard 6.

As the wire section is moved along path segment 76, the wire section is unwound from the tool member 10 which now has a slight reverse torque applied to it by the motor 22 under the direction of the controller device 4. This reverse torque ensures that the wire section will be dispensed in a controlled manner and will not spring off of the spool member 20 and tangle with itself.

The tool member 10 ends the routing operation by advancing towards a second set of placement posts 7b. Upon approaching this set of placement posts 7b, the tool member 10 is lifted upward to clear the tops of the placement posts 7b as shown at path segment 78, again drawn in the plane of the formboard 6 as shown in path segment 80 and then forced back downward as shown as path segment 82 so that the wire end is captured in-between the set of placement posts 7b. Path segment 84 is illustrated to show the final routing step of paying out the remaining short length of wire and the subsequent removal of the tool member 10 after the wire section has fully routed thereby allowing the tool member 10 to repeat this operation for the next section of wire.

Although the above described embodiment constitutes a preferred embodiment of the invention, it can be appreciated that modifications can be made thereto without departing from the scope of the invention.

We claim:

1. An automatic wiring arrangement for assembling wire harnesses having a plurality of wire segments included therein, said automatic wiring arrangement comprising:
   a process controlled robot manipulator;
   means for selectively controlling said robotic manipulator to a plurality of discrete positions within a predefined work area;
   tool means connected to said robotic manipulator for coincident movement therewith, said tool means being effective, during a first step, for receiving one of the wire segments, and during a second step, for routing the wire segment within said work area;
   said tool means further including a spool member and winding means for winding the wire segment around said spool member;
   said tool means further including a first end portion movable in a direction parallel to the axis of rotation of said spool member such that said wire segment is wound on said spool member in a helical manner; and
   a tail end portion through which a tail end of said wire segment extends, said tail end portion being disposed in said tool member at an angle perpendicular to said first end portion.

2. An automatic wiring arrangement as set forth in claim 1 further comprising a means for feeding wire to said tool means upon demand, said wire feeding means further being aligned with said first end portion of said tool means.

3. An automatic wiring arrangement as set forth in claim 1 further comprising motor means cooperatively engaging said spool member so as to rotate said spool member in a first direction during a wire acquiring condition, and to exert a reverse torque on said spool means during a wire routing condition.

4. An automatic wiring arrangement as set forth in claim 1 wherein said first end portion is disposed on a carriage member which movable along at least one guide rail disposed on an end of said tool means, said carriage member being movable along an axis parallel to the axis of rotation of said spool member.

5. An automatic wiring arrangement as set forth in claim 2 further comprising a clamping means disposed within said tool means for fixing a wiring segment in a predetermined position when said tool means is being moved relative to said wire feeding means.

6. An automatic wiring arrangement as set forth in claim 3 wherein said motor means exerts a greater force on said spool member during such wire routing condition than during such wire acquiring condition.

7. An automatic wiring arrangement as set forth in claim 1 wherein said tail end portion extends from the central axis of said spool member.

8. An automatic wiring tool apparatus operable in conjunction with a robotic manipulator for assembling wire harnesses having a plurality of wire segments included therein, said wiring tool apparatus comprising:
   a housing attachable to the robotic manipulator for coincident movement therewith;
   a first end portion having a first nozzle opening through which the wire segment enters said tool apparatus;
   spool means disposed within said housing for receiving the wire segments thereon, said spool means being aligned with said first nozzle opening so as to receive the wire segments therethrough;

winding means cooperatively engaging said spool means for rotating said spool means in a first direction to wind said wire segment around said spool means during a wire acquiring condition:

said first end portion being movable relative to said spool means such that the wire segment is wound around said spool means in a helical manner; and a tail end portion through which an end of one of said wire segments can extend, said tail end portion being disposed in said wiring tool apparatus at an angle perpendicular to said first end portion.

9. An automatic wiring tool apparatus as set forth in claim 8 wherein said tail end portion extends from the central axis of said spool member.

10. An automatic wiring tool apparatus as set forth in claim 9 further comprising an extension elbow disposed internally of said spool member and effective such that said tail end portion can be aligned with said first end portion over such perpendicular angle.

11. An automatic wiring tool apparatus as set forth in claim 8 further comprising a gap portion having a predetermined length and being disposed between an internal end of said first end portion and said spool member such that during a wire acquiring operation, a wire feed member can be extended substantially thereover.

12. An automatic wiring tool apparatus as set forth in claim 8 further comprising means for clamping the wire segments against movement during certain movements of said wiring tool apparatus.

13. An automatic wiring tool apparatus as set forth in claim 8 further comprising a carriage member movable along at least one rail member disposed on said housing, said carriage member having disposed thereon, said first end portion for coincident movement therewith.

14. An automatic wiring tool apparatus as set forth in claim 13 further comprising means for locking said carriage member against movement following operation of said winding means.

* * * * *